United States Patent [19]
Brown et al.

[11] Patent Number: 5,359,327
[45] Date of Patent: Oct. 25, 1994

[54] A/D CONVERTER SYSTEM WITH INTERFACE AND PASSIVE VOLTAGE REFERENCE SOURCE

[76] Inventors: Eric W. Brown; James A. Littlefield, both of 98 Baycrest Ct., Newport Beach, Calif. 92660-2922

[21] Appl. No.: 69,029

[22] Filed: May 28, 1993

[51] Int. Cl.⁵ .............................................. H03M 1/18
[52] U.S. Cl. .................................. 341/139; 341/141; 307/566
[58] Field of Search ................ 341/118, 120, 139, 141; 307/264, 302, 559, 561, 566

[56] References Cited

U.S. PATENT DOCUMENTS

| | | | |
|---|---|---|---|
| 4,222,110 | 9/1980 | Judell | 341/126 |
| 4,654,632 | 3/1987 | Yoshida et al. | 341/141 |
| 4,733,216 | 3/1988 | Wright | 341/131 |
| 4,827,191 | 5/1989 | Chapman | 341/132 |
| 4,860,011 | 8/1989 | Colles | 341/133 |
| 4,908,623 | 3/1990 | Ullestad | 341/167 |
| 4,933,676 | 6/1990 | Hauge et al. | 341/141 |
| 4,990,913 | 2/1991 | Beauducel | 341/139 |
| 4,998,106 | 3/1991 | Koga et al. | 341/139 |
| 4,999,627 | 3/1991 | Agazzi | 341/131 |
| 5,010,347 | 4/1991 | Yukawa | 341/143 |
| 5,023,783 | 6/1991 | Cohen et al. | 364/413.02 |
| 5,027,117 | 6/1991 | Yoshida et al. | 341/132 |
| 5,034,745 | 7/1991 | Kelly | 341/155 |
| 5,184,130 | 2/1993 | Mangelsdorf | 341/156 |

FOREIGN PATENT DOCUMENTS

| | | |
|---|---|---|
| 57-25722 | 2/1982 | Japan . |
| 59-27619 | 2/1984 | Japan . |
| 59-207732 | 11/1984 | Japan . |
| 3254217 | 11/1991 | Japan . |

OTHER PUBLICATIONS

Maxim, ±18-Bit ADC with Serial Interface Max 132 Manual, May 1992.
Maxim, ±18-Bit ADC with Serial Interface Max 132 EV Kit Manual, Jul. 1992.

*Primary Examiner*—Marc S. Hoff
*Attorney, Agent, or Firm*—Spensley Horn Jubas & Lubitz

[57] ABSTRACT

An A/D circuit to convert an analog signal to a digital signal. The circuit includes a low noise analog-to-digital conversion chip and a precision voltage reference source. The voltage reference source includes a diode with two terminals and a passive attenuation circuit. The attenuation circuit and the diode are coupled in parallel between the two terminals to provide a voltage reference signal for use by the analog to digital conversion chip. The analog to digital chip uses the voltage reference signal to set the full scale input range for the signal conversion, and the voltage reference signal is attenuated to correspond to the full scale range of the analog signal.

28 Claims, 11 Drawing Sheets

A/D CONVERTER SYSTEM WITH INTERFACE AND PASSIVE VOLTAGE REFERENCE SOURCE

FIELD OF THE INVENTION

This invention relates to A/D converters and, in particular embodiments, an A/D converter system having an interface to a personal computer (PC) and an A/D converter circuit which uses a passively attenuated voltage reference.

BACKGROUND OF THE INVENTION

Numerous types of analog-to-digital (A/D) conversion products are presently available. Many of these products are sold as bare circuit boards which allow incorporation of various different A/D chips and are used with a variety of data gathering platforms. Other products are sold as complete systems that can be connected to a personal computer (PC) and which then allow the user to collect data from a variety of sources. However, typical prior art products are deficient in their capability for low noise or substantially noise free operation, which inhibits their ability to adequately function in data acquisition systems for monitoring small DC voltage signals.

Some modern data acquisition systems interface directly with a PC. This allows for the efficient display and processing of the results, often in real time (or just a few milliseconds delay from true real time). The PC also provides a convenient way to store the large volumes of data, obtained from measurements, for later post-processing analysis.

Data acquisition systems typically combine input circuitry with an analog-to-digital converter (ADC) chip. Generally, the input circuitry of such systems receive input signals from a variety of transducers and the ADC produces digital outputs proportional to the varying level of the voltage of the input signals. ADCs typically have a full scale input voltage range of $\pm 2.5$ to $\pm 5$ V. To process a small DC voltage signal (i.e., a signal significantly less than the full scale input of the ADC), traditional systems typically employ one or more signal amplifiers to increase the small input voltage signal to correspondingly match the full scale voltage input range of the ADC chip. One drawback to this approach is that the amplification process introduces additional errors (i.e., noise) into the analog signal being amplified. Another common source of error and noise is the use of a multiplexer to sample several different analog inputs with a single ADC chip. This causes noise and spurious signal offsets due to the capacitive charge injection caused by switching between different wires containing the different analog inputs (e.g., often this noise plus offset is on the order of 10 mV peak to peak; see also FIG. 10) and can prevent the accurate measurement of small signals.

If the amplification is done correctly, then the full scale output of the amplified signal will match the full scale input in the A/D converter or at least use a significant portion of the ADC's full scale input voltage range. Therefore, amplification enables a user to view small signals with high resolution, since "extra bits" are added to the resolution. Thus, amplification of a $\pm 0.5$ V signal to a $\pm 5.0$ V signal which is converted in a $\pm 5.0$ V full scale ADC provides a 10 time increase in resolution.

Although the small input signals are typically filtered prior to amplification in an attempt to reduce the amount of noise that will be amplified, these errors cannot be totally eliminated; and they are amplified along with the signal. Moreover, the amplification process itself adds noise to the signal. Therefore, as the signal is amplified to increase the resolution during a conversion process, more noise is added to the signal. This tends to make it more difficult to accurately process small signals and adds uncertainty to the resulting digital output.

A typical "error-budget" for a small transducer signal (or measurement signal), which is amplified to match the full scale input range of an A/D converter chip ("Signal$_{atA/D}$") in a general PC-based A/D converter system, is a follows:

1. the transducer's signal or real measurement ("Signal$_{Device}$");
2. the transducer's inherent, self-generated noise ("Noise$_{Device}$");
3. environmental noise which radiates into the shielded and unshielded wire leads that connect the transducer to the amplifier ("Noise$_{AmpLeads}$");
4. environmental noise which radiates into the shielded and unshielded wire leads that connect the amplifier to the A/D input ("Noise$_{A/DLeads}$");
5. noise from the internal components that make up the amplifier ("Noise$_{AmpInt}$");
6. noise from the external components that make up the amplifier ("Noise$_{AmpExt}$");
7. span errors from temperature induced drift that affect the amplifier's internal gain stage ("Gain$_{AmpInt}$");
8. span errors from temperature induced drift that affect the amplifier's gain through the external components ("Gain$_{AmpExt}$");
9. input offsets in the amplifier which are multiplied by the gain ("Offset$_{AmpInput}$");
10. output offsets in the amplifier which are constants ("Offset$_{AmpOutput}$"); and
11. spurious signal errors due to multiplexing several analog inputs which have differing line capacitances and other sources of errors ("Signal$_{Spurious}$").

This error budget yields the following equation for the signal received at the input to the A/D chip:

$$\text{Signal}_{atA/D} = ((\text{Signal}_{Device} \pm \text{Noise}_{Device} \pm$$
$$\text{Noise}_{AmpLeads} \pm \text{Noise}_{AmpInt} \pm \text{Noise}_{AmpExt} \pm$$
$$\text{Offset}_{AmInput}) \times (\text{Gain}_{Ideal} \pm \text{Gain}_{AmpInt} \pm$$
$$\text{Gain}_{AmpExt} \pm \text{Signal}_{Spurious} \pm \text{Offset}_{AmpOutput} \pm$$
$$\text{Noise}_{A/DLeads}$$

where the Gain$_{Ideal}$ equals the amplifier's desired gain multiplier. Depending upon the actual circuit being evaluated, the Signal$_{Spurious}$ term may or may not be multiplied by the gain of the three Gain terms.

This Signal$_{atA/D}$ leads to the following equation for the resulting output resolution for the signal:
Number of Bit-counts from the A/D as a Digital Output$= \pm$Integer[(Signal$_{atA/D}$/V$_{ref}$)$\times 2^n$]
Where n=the number of bits of resolution.

The above-described error budget is not the only source of errors. Additional measurement errors in the output signal are caused by the A/D convertor's voltage reference circuitry. Generally, A/D circuits use a voltage reference ("V$_{ref}$") signal to set the full-scale input of the ADC chip. The ADCs use a variety of comparison techniques to arrive at the number of bitcounts a signal value represents when compared to the full scale represented by the value of $V_{ref}$. The $V_{ref}$ is assumed to represent the maximum number of bits in the ADC. For example, if the voltage reference is 100 and the Signal$_{atA/D}$ is 95; then the bit count in an 18 bit ADC is 249,036; on the other hand, if the Voltage reference is actually 101, then the bit count should be 246,571—an error of 2,465. Therefore, small errors in the $V_{ref}$ result in errors in the digital output signal.

The affects of all these errors on the conversion of a small signal from analog to digital can be demonstrated through some simple tests. One such test measures the noise present in an A/D circuit when there is a zero voltage level input applied to the ADC. This is called a "zero voltage level noise test." To perform the test for an actual real world application, the leads connecting the sensor to the PC based A/D circuit are disconnected and the positive and negative leads are tied together so that there is no voltage differential between them. Specifically, the leads are tied together as close to the sensor and as far from the PC as possible. This is because most sensors are located a distance from the PC in real world applications to prevent noise from the PC containing the A/D circuit from radiating into the sensor setup. Often the lead length distances are on the order of 6 to 20 feet or more. Typically, shielded cable is used with the shield tied to analog ground. Theoretically the results of this test should yield zero volts because any noise which radiates into the shielded cable or any capacitive effects on the cables in this zero voltage level noise test would be canceled out via the differential inputs, since the positive and negative sides of the ADC input see the same input voltages induced by the noise.

Most manufacturers perform a different version of this test, and the results of this alternate version of the test are often far better than the results achievable in the real world test described above. In the alternate version of this test, the manufacturer shorts the input pins of the ADC chip together as close as possible to the ADC chip, not as close as possible to the sensor or area of actual usage. Usually, the lead length is only a few inches long or even less than one inch for this test. This short lead length is usually comprised of the metallic traces on the actual printed circuit board to which the ADC chip is mounted and terminates at the connector mounted on the same printed circuit board. In the event that a multiplexer is present to sample several analog inputs to a single ADC chip, the short lead length also substantially reduces the effects of the line capacitance. Since the input signal is essentially 0 volts, the charge injection problem is minimized and a very good sounding specification may placed on the equipment. Therefore, no user can directly connect a device to the ADC circuit boards under the same conditions, and a circuit specification is determined for the system that has no bearing in the real world.

A typical real world input voltage test result is shown in FIG. 10. The results were generated by a conventional Analogic Corp. (Peabody, Mass.) High Speed DAS 16-bit analog-to-digital data collection board (Part No. HSDAS-16). The board is specified as having a resolution of 38 $\mu$V (or $38 \times 10^{-6}$ V) and is purported to have the capability to take accurate readings below 1 mV (or $1000 \times 10^{-6}$ V). The board's specification also purports to have a maximum noise level of 76 $\mu$V. However, in the test represented by FIG. 10, the product exhibited an inherent noise and offset of about 250–1000 $\mu$V RMS, and the peak-to-peak noise level often exceeded 10 mV. The larger peaks were the result of a multiplexer charge injection as different channels were scanned. During the test, the nominal on-board amplifier gain was set to 4.0 and approximately 6–8 feet of cable length was present between the area where the leads were tied together and the ADC chip on the printed circuit board. This long lead length was necessary because the PC radiates environmental noise that could be detected by the transducer to be used in this particular test setup. Also, this test setup involved the use of fluids and it was desirable to have the PC as far away as possible from the source of a potential spill or leak. The readings on eight differential inputs were scanned during this test.

In traditional ADC circuits, such as the HSDAS-16, the multiplexer is used to alternately measure several different analog voltage sources using a single ADC chip. The multiplexer also helps to protect the ADC chip from high voltages, such as a static discharge, that might damage the ADC chip.

Low pass filtering can help to smooth out the noise, but it does not have a significant affect on the offsets or uncertainty in the readings. The plot in FIG. 10 shows the results in only one channel, but each tested channel had a similar output curve with the only difference being the amount of the offset voltage errors.

Another test which can be performed is called a "fixed response transducer test". In this test, a pressure transducer is surrounded by a shielded, grounded metal case which is connected to the A/D data acquisition system. The pressure transducer is then given a thermally stable fixed head height of input pressure from a static column of water at room temperature. The thermal mass of the fluid is sufficient to prevent any measurable thermal drift in the sensor over a 1 to 10 minute test period. The fluid temperature during the test is monitored with a thermistor to within 0.1° C. The output of the transducer is then measured for noise. It is assumed that offsets and span errors cannot be measured with certainty, but they will still be within the transducer data. Tests performed on the Analogic system described above, yielded results which are quite similar to those shown in FIG. 10, but at a baseline voltage closer to the full scale analog signal from the pressure transducer (i.e., about 100 mV).

SUMMARY OF THE DISCLOSURE

It is an object of an embodiment of the present invention to provide an improved analog to digital converter circuit, such as for use with small signals and the like, and which obviates for practical purposes, the above mentioned real world limitations. In particular embodiments the improved analog to digital convertor circuit uses a passively provided voltage reference signal to substantially eliminate noise in the conversion from an analog to a digital signal.

According to an embodiment of the invention, an A/D converter circuit is used to convert an analog signal into a substantially noise free digital signal. The circuit includes a low noise analog-to-digital conversion chip (ADC) and a passive voltage reference source. The voltage reference source includes a diode with two terminals and a passive attenuation circuit. The attenuation circuit and the diode are coupled in parallel between the two diode terminals to provide a voltage reference signal for use by the ADC. The ADC uses the voltage reference signal to set the full scale input range used in the conversion operation. In preferred embodiments, the voltage reference signal is attenuated to closely match or correspond to the full scale input range of the analog signal. Moreover, the circuit is particularly well suited to measure small DC voltage signals.

In further embodiments of the present invention, the passive attenuation circuit defines a resistor in a resistor and capacitor network. The resistor and capacitor network may provide a single pole low pass filter to attenuate high frequency noise in the reference voltage measurement. Moreover, the ADC may be capable of performing an auto-zero to reduce effects of a system drift.

In still further embodiments, the A/D converter circuit may include a multiplexer chip coupled with filter networks to selectively filter the analog signal prior to sending the filtered signal to the ADC for conversion from an analog to digital signal. Moreover, the A/D convertor circuit may include current output circuitry (i.e., drivers) and connections which can be used to drive analog transducers. In preferred embodiments, an A/D convertor circuit has a power source that is remotely located relative to the ADC to reduce the noise interference from the power source.

In particular embodiments of the present invention, the A/D converter circuit is included in an A/D converting system. The A/D converting system converts an analog signal into a digital signal while minimizing noise. The system includes an interface circuit and an A/D convertor circuit, as described above, coupled to the interface circuit. Preferably, the system provides means for selecting the level of attenuation of the voltage reference signal provided by the passive attenuation circuit. In traditionally designed A/D converting systems, the total system noise is typically less than about 10 mV peak-to-peak. However, in the preferred embodiments the total system noise is typically less than about 10 $\mu$V peak-to-peak or an improvement by a factor of about 1000.

In further system embodiments, the interface can accommodate a plurality of (e.g., eight) A/D converter circuits. Further the interface circuit may be cascaded together with at least one additional interface circuit. Moreover, in preferred embodiments the interface circuit may be cascaded with as many as thirty two other interface circuits, such that as many as, for example, 256 A/D converter circuits may be supported.

In other embodiments, there is no interface circuit and the A/D convertor circuits are directly connected to a personal computer in parallel with at least one other A/D convertor circuit. However, in preferred embodiments, the system uses a personal computer connected to the interface circuit, and wherein the personal computer is used to control and drive the A/D converting system through the interface circuit.

Other features and advantages of the invention will become apparent from the following detailed description, taken in conjunction with the accompanying drawings which illustrate, by way of example, various features of embodiments of the invention.

BRIEF DESCRIPTION OF THE DRAWINGS

The detailed description of embodiments of the invention will be made with reference to the accompanying drawings, wherein like numerals designate corresponding parts in the several figures.

DETAILED DESCRIPTION OF PREFERRED EMBODIMENTS

Figure 1:
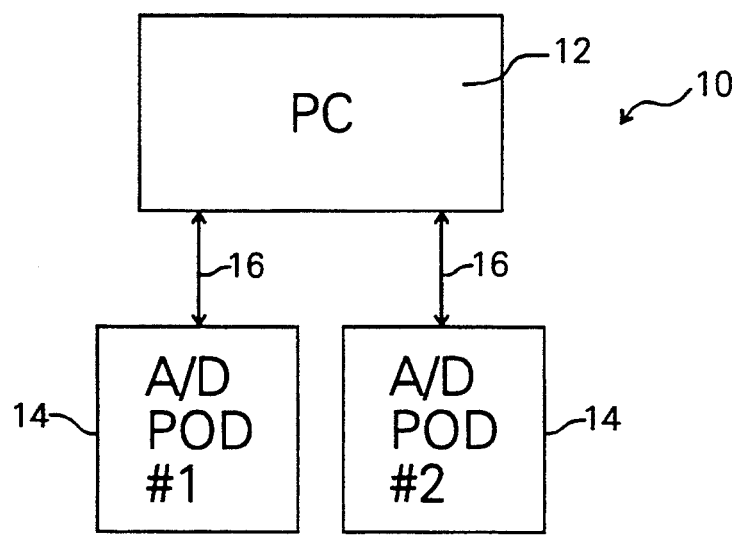
FIG. 1 is a block diagram of an A/D conversion system according to a first embodiment of the present invention.

Preferred embodiments of the present invention, relate to an A/D converter system used for measuring low level electrical signals in sensitive electronic apparatus, such as medical monitoring devices, seismic activity monitoring devices or the like. Commonly, these low level signals are generated by various forms of strain gauges or piezo-resistive transducers. However, further embodiments of the invention may be used to measure other types of signals which are converted from analog to digital signals. The A/D converter systems according to embodiments of the present invention are particularly well suited for sensitive measurements which present the user with a low signal to noise ratio.

Embodiments of the present invention are based in part on the principle that system noise may be minimized by reducing the number of noise inducing circuit components, especially active components, such as an amplifier or the like. Thus, embodiments of the present invention eliminate the amplifiers commonly used in A/D convertors to amplify the small input signal, and instead have an A/D circuit that will accept a low level signal directly. Moreover, since there are only a small number of ICs and discrete components in the low level signal path, thermally-induced junction voltage errors are minimized.

Further embodiments include such features as a software selectable filtering of the input signal, an on-board constant current source, jumper bridges to allow selectable full scale input ranges for the V$_{ref}$, and overvoltage protection for the analog inputs. Moreover, the entire A/D converter and data acquisition circuit may be compact in size which allows it to be readily disposed in remote locations and to interface externally with a host processor (i.e., a PC) via serial or parallel data links. Thus, the A/D converter circuit may be positioned close to the transducer sensor, to minimize the length of the electrical connection (e.g., cable) between the A/D converter circuit and the transducer sensor, and therefore minimize the noise induced in the electrical connection.

Preferably, the A/D converter hardware is designed to readily connect to a standard PC serial port (known as RS-232 by most computer users) for transmitting data to the PC which provides data acquisition control and analysis functions. Thus, no special adapter cards have to be installed in the PC. Moreover, the use of the standard serial port allows the PC to be located a great distance from the ADC circuit and the transducer whose analog signal is being measured.

In the illustrated embodiments, remotely located A/D data acquisition circuits (A/D pods) perform the conversion of an analog signal to a digital signal. In some embodiments, as many as eight A/D pods may be connected to a microprocessor controlled interface circuit which obtains the data from each A/D pod. The A/D pod may be used in a freestanding manner or it may be a subsystem within a PC-based data acquisition system. When the A/D pod is connected to a PC, the data can be readily viewed and recorded in real time (or near real time). Also, the data may be analyzed or manipulated in real time (or near real time) for use by other instruments or equipment.

Certain embodiments of the invention are particularly suitable as a "test and measurement" instrument for engineers and scientists working with low level DC electrical signals (i.e., under 0.5 V), such as from pressure sensors, strain gages, or chromatography equipment. The A/D pod may also be incorporated directly into medical devices designed for processing very small physiological signals. Embodiments of the A/D pod system may be particularly well suited for providing a low noise reading from a medical pressure sensor used in a hospital or home health care environment, both of which are typically electrically noisy environments. In this type of real world application, the A/D pod must measure unamplified differential DC voltages of approximately 300 $\mu$V (or about $300 \times 10^6$ V) to an accuracy better than 1% or about 3 $\mu$V. Moreover, this type of differential signal is often superimposed on a DC signal that varies from about 1.0–200.0 mV. Therefore, the A/D pod should have a measurement accuracy of 3 ppm (parts per million). To achieve this accuracy with reasonable levels of certainty, it is necessary to measure a raw signal with a less than 1.0 $\mu$V resolution. Currently available PC based systems as described in the background section are inadequate for providing such measurements unless the analog signal is highly amplified, and then the signal is subject to the error factors discussed above.

FIG. 1 shows an A/D converter system 10 according to an embodiment of the present invention. This system includes a PC 12 coupled to two A/D pods 14 by data lines 16. In this embodiment, the PC is equipped with a parallel input/output (PIO) card, such as the Universal Digital I/O Interface (Model No. D-MAX54DIO48) sold by Personal Computing Tools, Inc. (Campbell, Calif.). The system 10 is capable of parallel processing the data from the two A/D pods 14 without an external auxiliary interface circuit. The A/D pods 14 interface directly with the PC 12 using line 16 connected to standard RJ-45 8 pin ports on the A/D pods 14 and the screw terminals on the PIO card within the PC 12. This parallel configuration allows the user to take as many as two measurements in real time for direct comparison of the results. In operation the A/D pods convert measurements from transducers (not shown) into digital signals which are then sent to the PC 12 for further processing and display. The received data can then be stored on the PC 12 for later access and/or post processing. In this embodiment, control command signals are supplied directly by the PC 12 to A/D pods 14 over lines 16. Power is provided by an external power supply. This embodiment may be currently limited to two parallel A/D pods 14 by the number of signal lines on the PIO card. However, PIO cards with more digital lines may accept more A/D pods 14.

Figure 2:
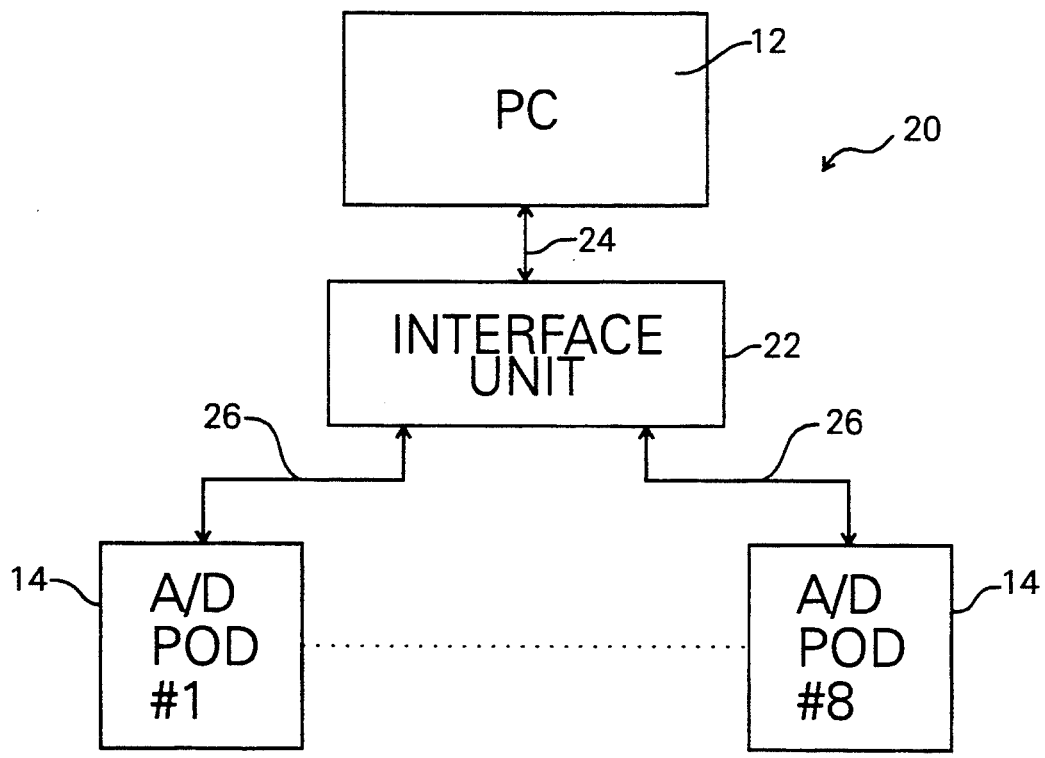
FIG. 2 is a block diagram of an A/D conversion system according to a second embodiment of the present invention.

A second embodiment of an A/D converter system is shown at reference numeral 20 in FIG. 2. The A/D convertor system 20 is composed of a PC 12, an interface unit 22 and a plurality (e.g., up to eight) A/D pods 14. The interface 22 is serially coupled to the PC 12 through line 24 using a RS-232 standard 9 pin port, and the A/D pods 14 are serially coupled to the interface 22 by lines 26 using a standard RJ-45 8 pin ports found on both the A/D pods 14 and the interface unit 22 circuit board. The interface unit 22 receives data from each of the A/D pods 14, and then forwards the received data to the PC 12 for processing over lines 24. As in the first embodiment, described above, the PC 12 can display and store the data for post processing.

The PC 12 is controlled by a host software program "TVIHOST" to communicate with the interface unit 22 and the A/D pods 14. A hard copy of a preferred embodiment of the TVIHOST program is attached as Appendix A as an example. However, further embodiments may employ other suitable programs. Preferably, the program controls the PC 12 to provide command signals to the interface unit 22 which then translates and passes command signals on to the appropriately selected A/D pods 14. The program also controls storage operations for storing of the collected data on suitable storage media, such as magnetic disks or the like, for later analysis of the data, as well as real time waveform and/or numeric displays. For instance, if a numeric display mode is selected, a 1-second mean and RMS noise levels are computed and displayed in real time. The TVIHOST program generally collects and stores the data in a binary format for quicker processing and later access. However, this format is not generally compatible with spreadsheets or other analysis software. Therefore, the TVIHOST program preferably includes a second program, EXP, which may be used to translate binary data into several different standard tabular formats which are easily imported into commercially available PC-based spreadsheet programs.

The interface unit 22 is the gateway between the PC 12 and the A/D pods 14. The interface unit 22 handles and translates all commands from the PC 12. Thus, a standard PC 12 only requires a standard, built in RS-232 serial port and the software to access the interface and the A/D pods; no additional hardware is required. All time critical interfaces to the A/D pods 14, such as when to send data and receive commands, are handled by the interface unit 22. Moreover, the interface unit 22 supplies the power to the A/D pods 14. The interface unit 22 also handles other functions, for example, commanding an automatic zero level compensation that reduces the noise from thermal drift. It should be understood that the A/D pods 14 are not limited to use with the interface unit 22 of the present embodiment, but may be used with any suitable PC or interface.

Figure 3:
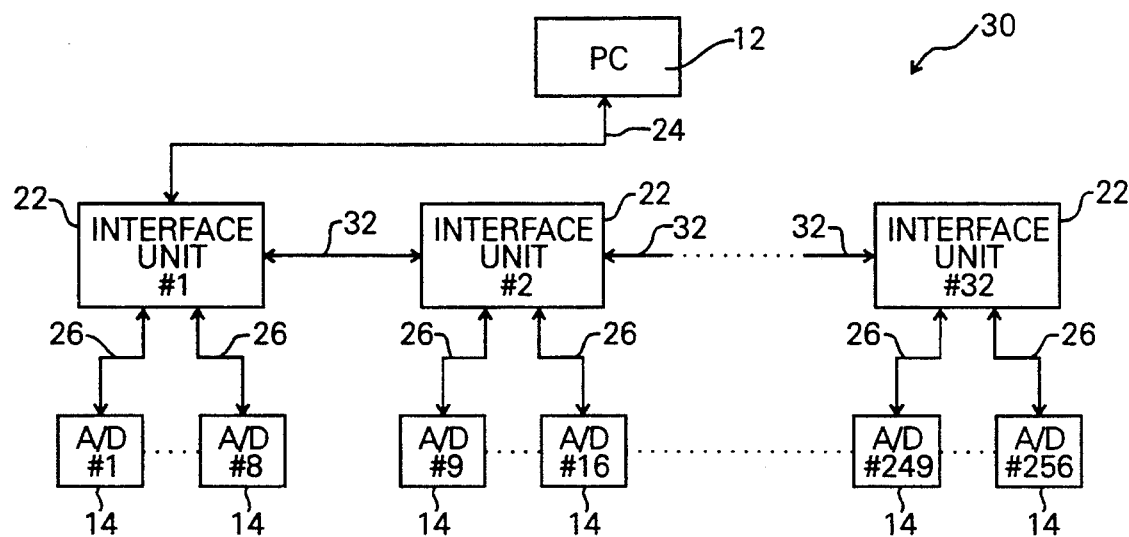
FIG. 3 is a block diagram of a variation of the second embodiments shown in FIGS. 2 and 3.

FIG. 3 illustrates a third embodiment, which is a variation of the embodiment shown in FIG. 2. This system 30 has a plurality of interface units 22 that are serially cascaded together by lines 32 using standard RS-232 9 pin ports. It is possible to cascade a first plurality X (e.g., as many as thirty two) of separate interface units 22; and since each interface unit 22 can support a second plurality Y (e.g., up to eight) of separate A/D pods 14, the cascaded system 30 may monitor as many as X * Y (e.g., up to 256) individual A/D pods 14 using one PC 12. The first interface unit 22 in the cascade is connected by an RS-232 line 24 in the same manner as shown in FIG. 2. Each additional interface unit 22 is connected to an adjoining interface unit 22 by an RS-232 line 32. The cascade system 30 uses the same TVI-HOST program described above, to allow the PC 12 to communicate with the multiple interfaces 22 and all of the connected A/D pods 14. Therefore, the A/D converter system 30 may be readily expanded as measurement needs grow.

Figure 4:
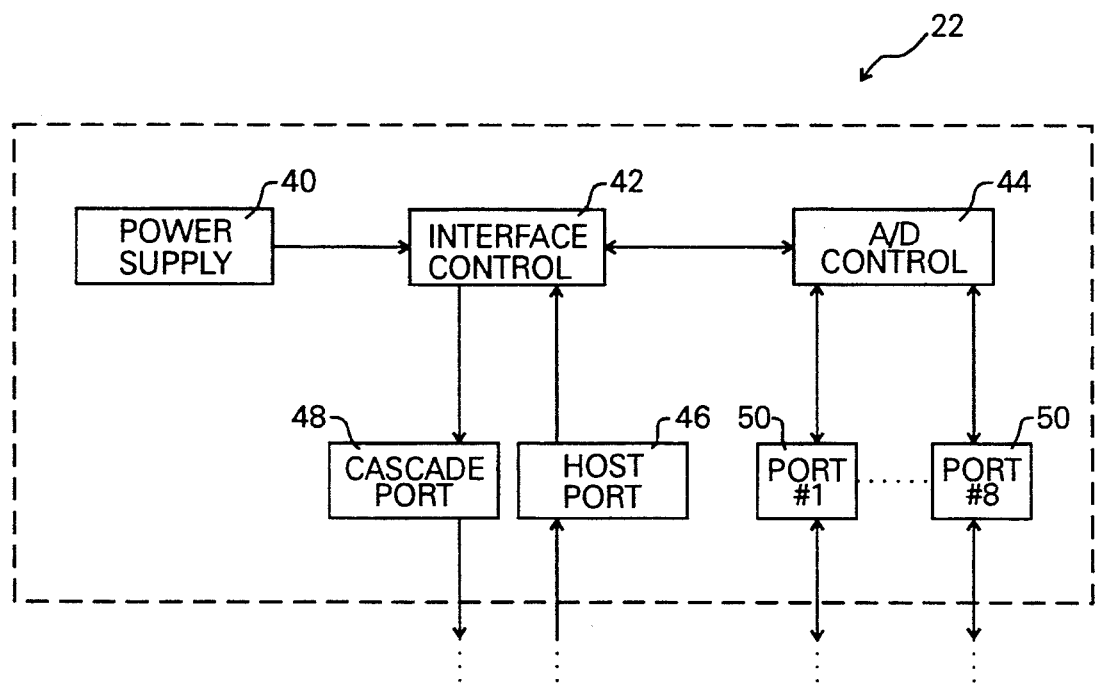
FIG. 4 is a block diagram of the interface unit used in the embodiment shown in FIG. 2.
Figure 5A:
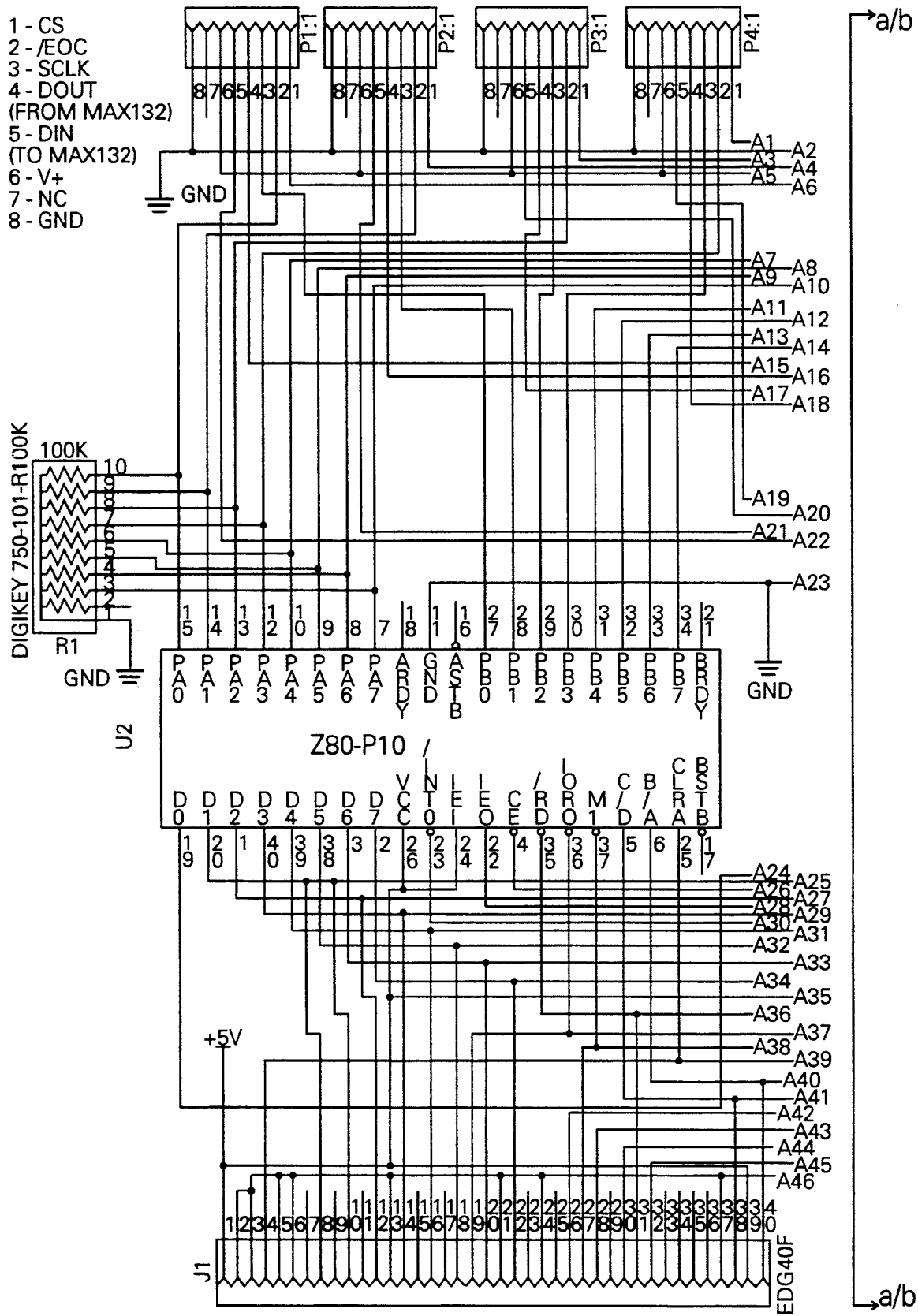
FIGS. 5(a)–(d) illustrate a detailed circuit schematic of the interface unit shown in FIG. 4.
Figure 5B:
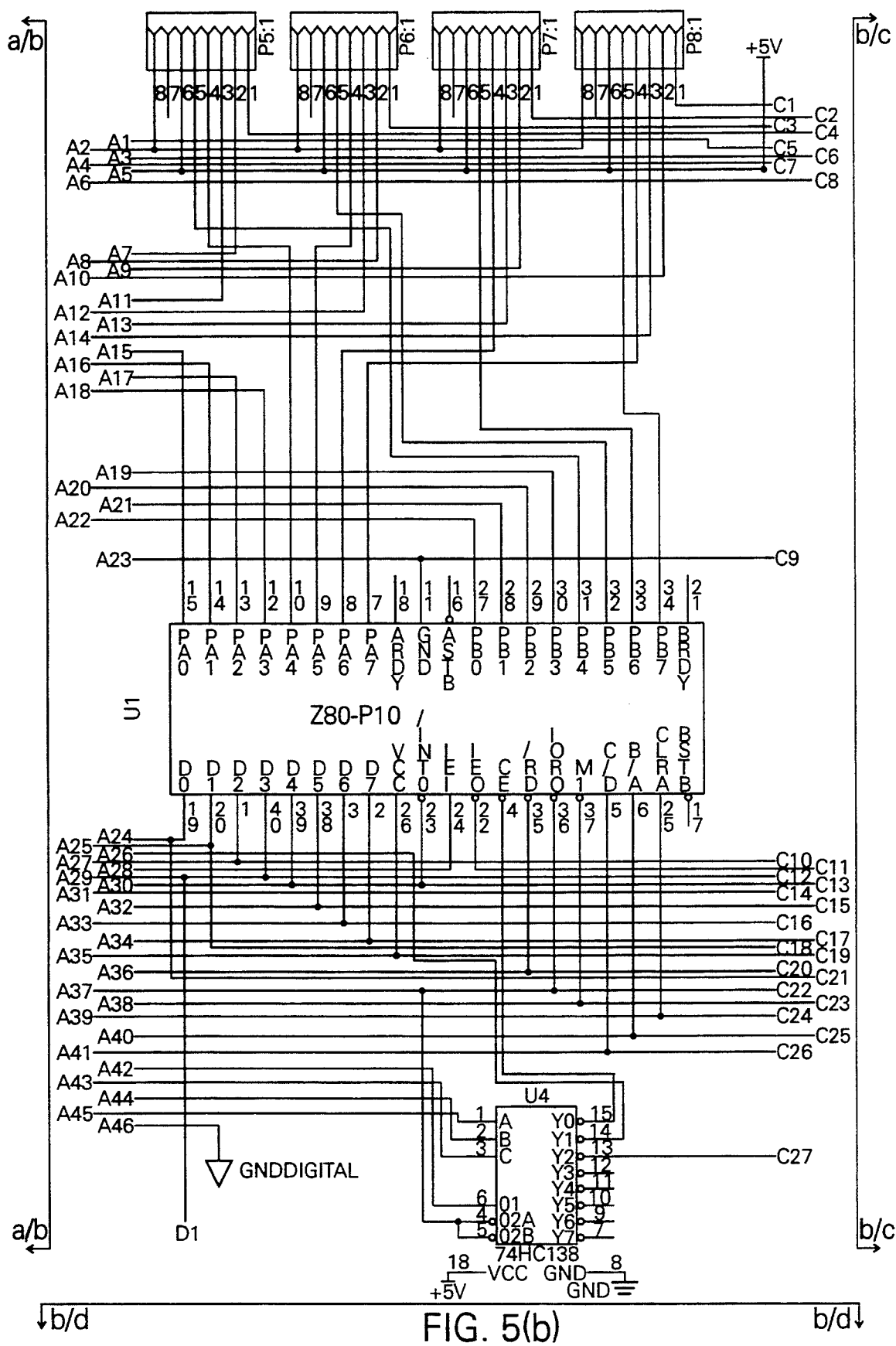
Figure 5C:
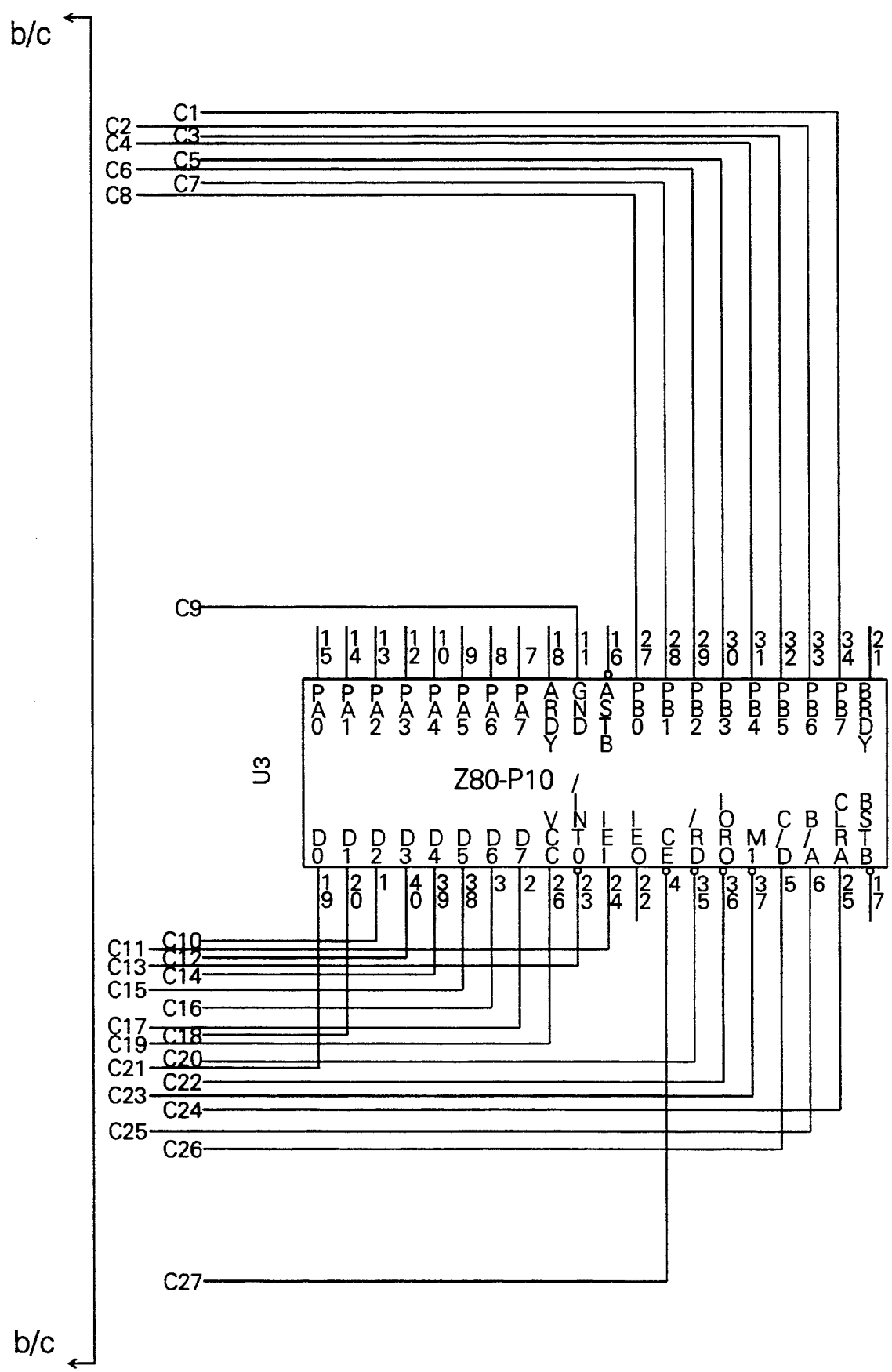
Figure 5D:
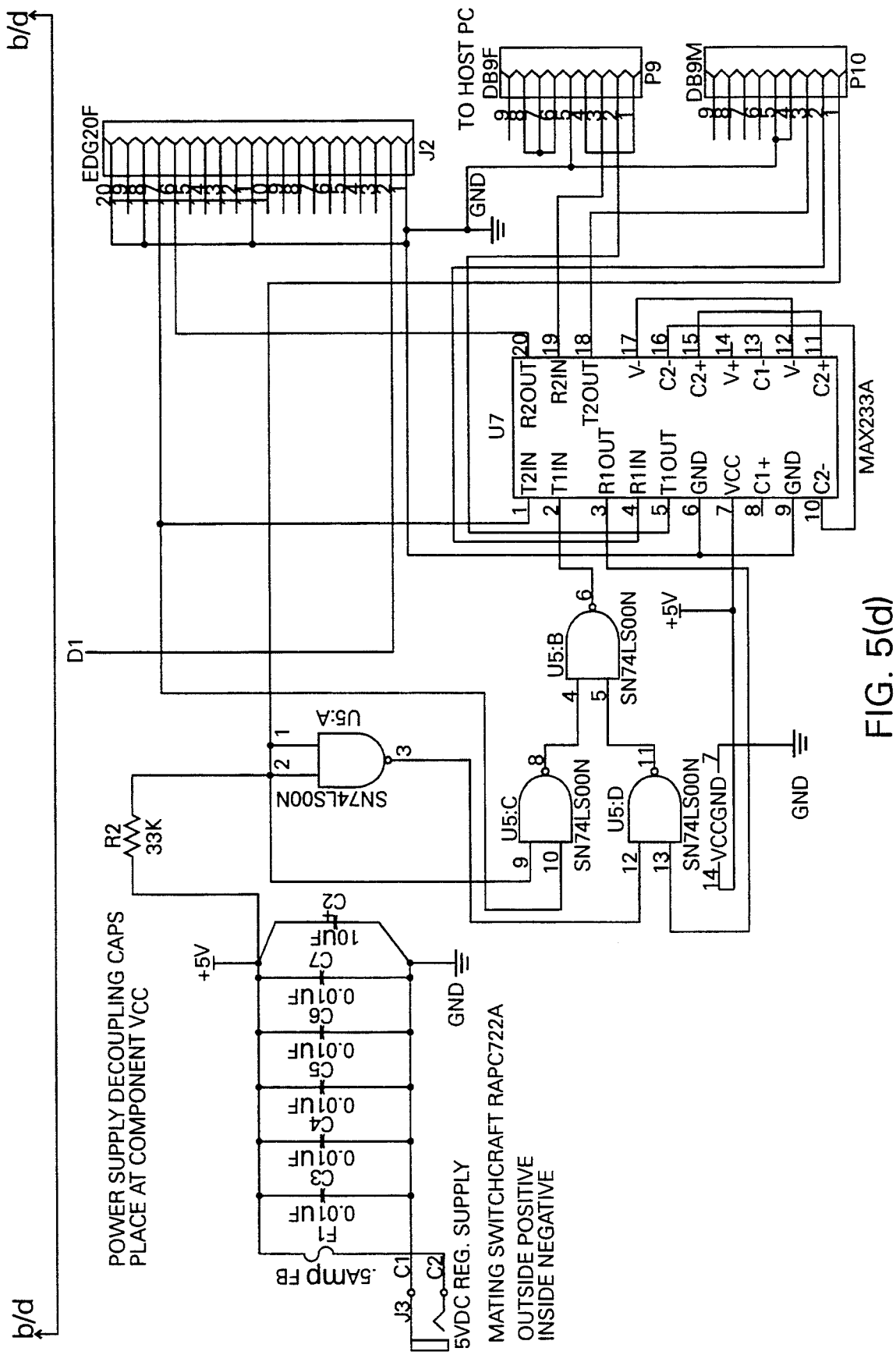

FIG. 4 shows a block diagram of the interface unit 22 used in the embodiments illustrated in FIGS. 2 and 3. The interface unit 22 has a power supply 40, an interface control 42, and an A/D control 44. The power supply 40 provides the +5.0 V power for both the interface unit 22 and all attached A/D pods 14. The ability to supply power to the interface control 42 and the A/D pods 14 from the power supply 40 provides several advantages, including the advantage of minimizing the number of individual power sources required, and the advantage of avoiding a major source of environmental noise (the power supply), since the power supply is external to the remote A/D pod 14. However, it should be recognized that further embodiments of the interface unit 22 may provide other power levels, and the A/D pods 14 may be powered by an internal source rather than externally powered.

The interface control 42 interfaces with the host PC 12 through a host port 46, and to other cascaded interface units 22 through a cascade port 48. Ports 46 and 48 are standard RS-232 9 pin serial ports. The interface control 42 includes a programmed processor circuit (e.g., controlled by a program recorded in a ROM device) which allows the interface unit 22 to prioritize itself among the other cascaded units 22 and to properly time the delivery of data to the PC 12. Moreover, the interface control 42 functions as a translator which receives command signals from the PC 12 and converts them into command signals for the A/D pods 14. Because these timing and translating functions are performed by the interface 22, the individual A/D pods 14 may be relatively simple in construction and small in size.

The interface control 42 is responsible for sending the data received from the A/D pods 14 to the PC 12. Typically, the data is sent to the PC 12 as a differential digital signal, since this reduces the amount of information that must be sent and allows higher communication rates. The differential digital signal only transfers the lowest number of bits which have changed since the last analog-to-digital conversion. However, it should be recognized that, according to further embodiments and as a user selectable option in the TVIHOST software, the entire digital signal provided by the A/D pods 14 may be sent to the PC 12.

The A/D pods 14 are controlled by the A/D control 44 through interface ports 50. The interface unit 22 has eight RJ-45 standard 8 pin connector ports 50, and the A/D pods may be connected into any one of the ports 50 or in any order. The interface unit 22, through the A/D control 44, prioritizes and handles all communications to the A/D pods 14. The A/D control 44 communicates with the A/D pods to control filter methods, system timing and other measurement parameters. The A/D control 44 receives data from the individual pods 14 and then sends the data to the interface control 42 which translates the data into a differential digital signal to be sent to the PC 12.

FIGS. 5(a)-5(d) show a detailed circuit schematic of a preferred embodiment of an interface unit 22. The illustrated interface unit 22 uses a Z-World Engineering Inc. (Davis, Calif.) single board computer, known as the model SmartBlock. This computer board uses a Z80 18.6 Mhz microprocessor to translate and process the command signals and data transfer between the A/D pods 14 and the PC 12. The ROM device containing the interface unit 22 instruction set is mounted on the single board computer.

Figure 6:
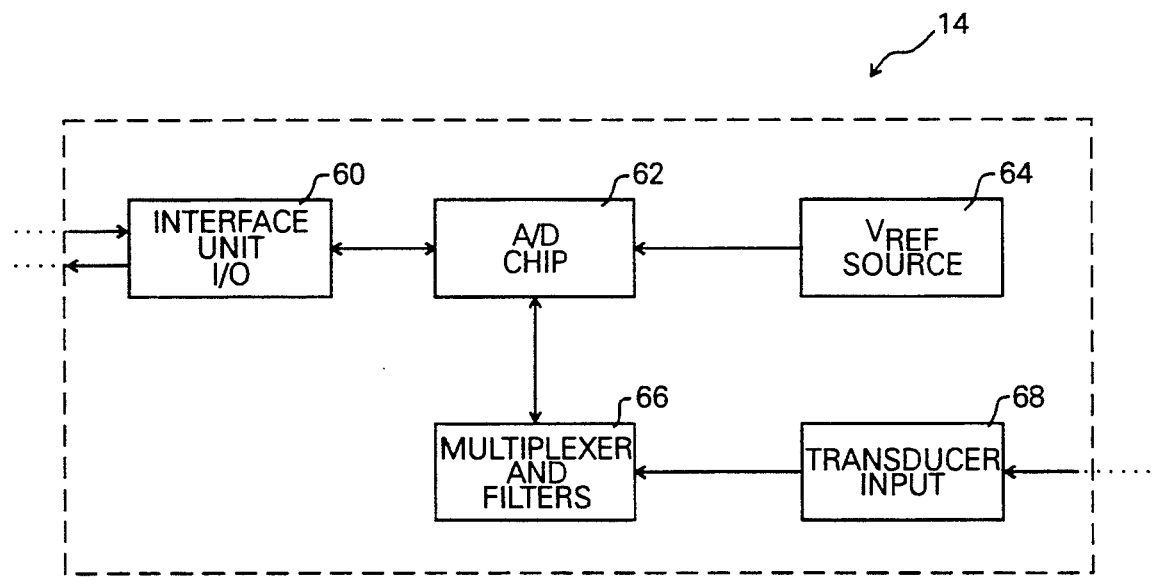
FIG. 6 is a block diagram of the A/D pods shown in the embodiments of FIGS. 1-3.

FIG. 6 shows a block diagram of an A/D pod 14 which may be used in the embodiments shown in FIGS. 1-3. The A/D pod 14 includes an interface unit I/O (Input/Output) 60, an ADC (Analog-to-Digital Chip) 62, a $V_{ref}$ (Voltage reference) source 64, a multiplexer 66 with filters, and a transducer input 68.

The interface unit I/O 60 supports communication with the interface unit 22. The I/O 60 uses an RJ-45 8 pin port to receive command signals from the PC 12 through the interface unit 22. The received command signals are used to control the A/D pods timing and how the A/D pod 14 will filter and convert the analog signal received from the transducer input 68 to a digital signal. Moreover, the I/O 60 receives a power signal and provides power to the A/D pod 14. The I/O 60 is connected to the ADC 62 which is used to control the other blocks in the A/D pod 14.

The ADC 62 receives command signals from the I/O 60, and provides command signals to control the multiplexer 66. The command signals from the ADC 62 determine which filters connected to the multiplexer 66 are used in processing the analog signal before conversion to a digital signal. The full scale input range to the ADC 62 is set by the $V_{ref}$ provided by the $V_{ref}$ source 64. Once the full scale input range is set, the filtered output signal from the multiplexer 66 is compared with the $V_{ref}$ signal and the ADC 62 produces a digitized signal based upon this comparison. The digitized signal is then sent by the ADC 62 to the interface unit I/O 60 where it is sent back to the PC 12 for display and further processing. In the preferred embodiments, the ADC 62 continuously converts the analog signal into a digital signal, and the interface unit 22 only transmits the digital signal to the PC 12 when a new update is required by the PC 12. This method tends to lighten the communication load and further simplify the design of the A/D pod 14. However, in other embodiments, the ADC 62 need not convert the signal continuously, and the user may select nearly any conversion rate slower than 16 times per second.

The transducer input 68 to the A/D pod 14 is used to receive the analog signal from the transducer (not shown) and provides the signal to the multiplexer 66 for filtering. In some embodiments of the present invention, the A/D pod 14 may be provided with a constant current source which can be used to power and drive the transducer. This can simplify the construction and cost of systems which use transducers with the A/D pods 14. However, the transducer may be internally powered or powered by a source other than the A/D pod 14. Other embodiments of the A/D pod 14 may include a constant voltage source or other suitable driver which can be used to power and drive other transducers.

The multiplexer 66 receives the analog signal from the transducer input 68 and filters the information prior to sending the analog signal to the ADC 62. In preferred embodiments of the present invention, the multiplexer has four filtering options. However, the multiplexer may utilize any number of filters and more than one multiplexer may be used. In addition to filtering, the multiplexer provides protection to the input terminals of the ADC chip from high voltages such as a static discharge.

The full scale input range of the ADC 62 is determined by the $V_{ref}$ signal which is produced by the $V_{ref}$ source 64. In preferred embodiments of the present invention, the $V_{ref}$ source 64 is a precision source that does not use active elements, such as an amplifier or a power supply, to generate the $V_{ref}$ voltage reference signal. Rather, the $V_{ref}$ is generated by a diode and passively attenuated to form an input range that closely matches the full scale input range of the unamplified analog signal. This removes a substantial portion of the noise sources that are found in the prior art A/D convertor circuits which utilize amplifiers to create a gain stage for the analog signal. Thus, the use of a $V_{ref}$ that is passively attenuated can provide significant advantages over the prior art systems discussed in the background section, in that this feature can result in a substantial reduction of noise in the converted signal.

Figure 7:
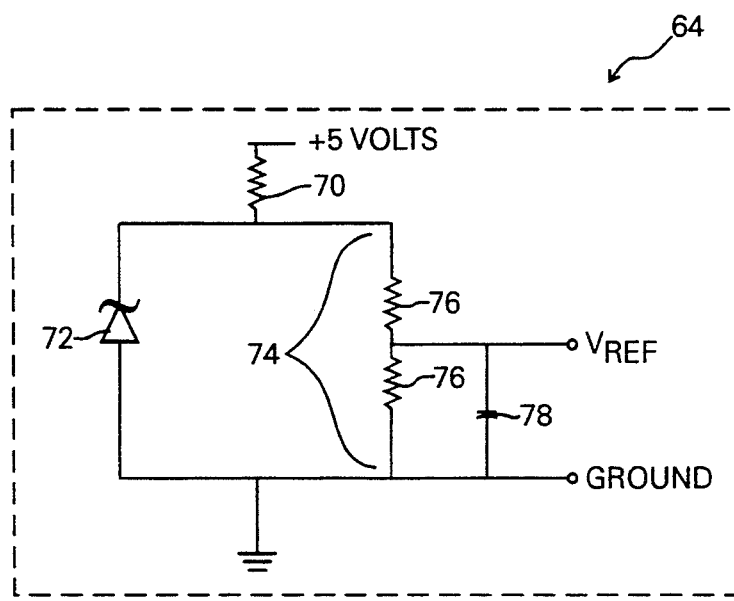
FIG. 7 is a circuit diagram of the voltage reference source illustrated in FIG. 6.

FIG. 7 shows a circuit schematic of an embodiment of the $V_{ref}$ source 64 used by the A/D pod 14. The $V_{ref}$ source 64 does not use an amplification circuit to determine the full scale input range used by the ADC 62 (see FIG. 6). Rather, it is attenuated to match the range of the small analog signal. To provide the $V_{ref}$, the power from an external source, such as the interface unit 22, is attenuated through a first resistor 70. One end of the resistor 70 is coupled to the power source and the other is coupled to a diode 72 and a passive attenuation circuit 74. The passive attenuation circuit 74 is coupled in parallel to the ends of the diode 72. Typically, the passive attenuation network is formed of one or more resistors 76 and one or more capacitors 78 connected in parallel, as shown in FIG. 7. In preferred embodiments, a precision zener diode is used with a resistor chip and a capacitor. However, the circuit may use any suitable diode or resistor which provides the proper level of attenuation. The passive attenuation circuit may also include a capacitor to form a single pole, low pass filter to reduce high frequency noise (e.g., greater than 32 Hz). In preferred embodiments of the present invention, the $V_{ref}$ is attenuated to provide a full scale input range of ±200 mV to ±500 mV which provides a resolution of approximately 0.763 μV to 1.907 μV per count of the A/D converter.

Figure 8A:
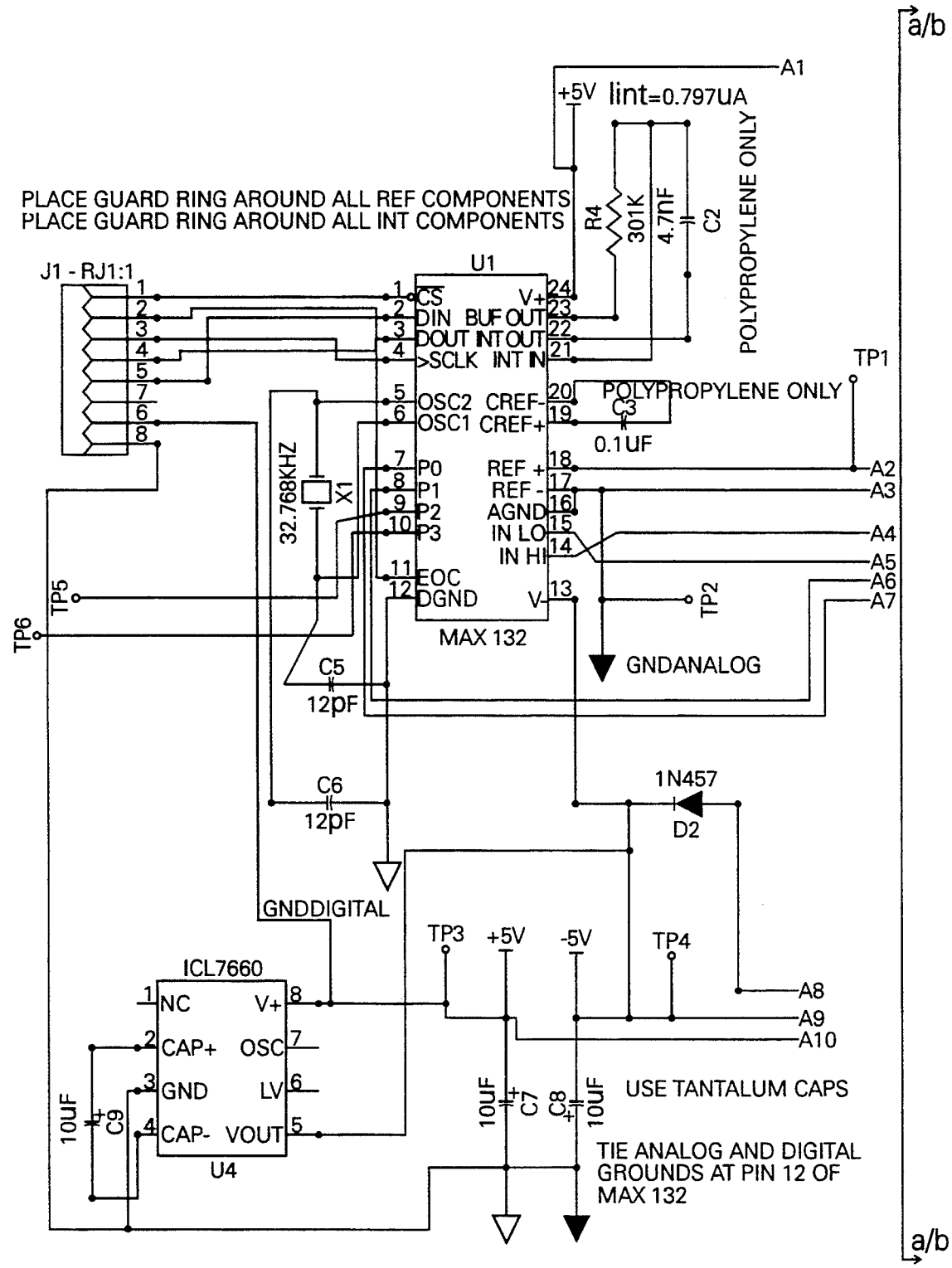
FIGS. 8(a)–(c) illustrate a detailed circuit schematic of the A/D pod shown in FIG. 6.
Figure 8B:
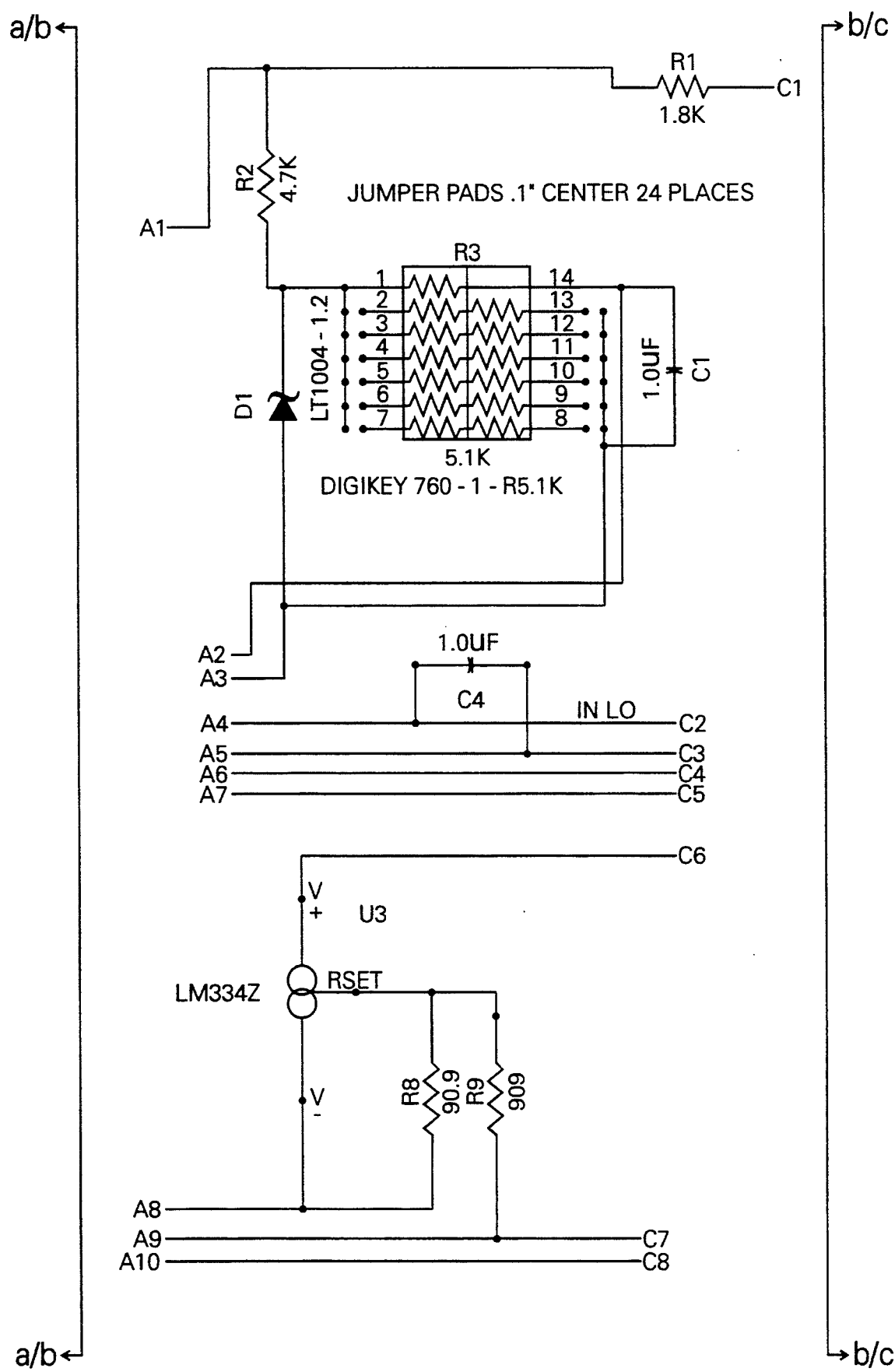
Figure 8C:
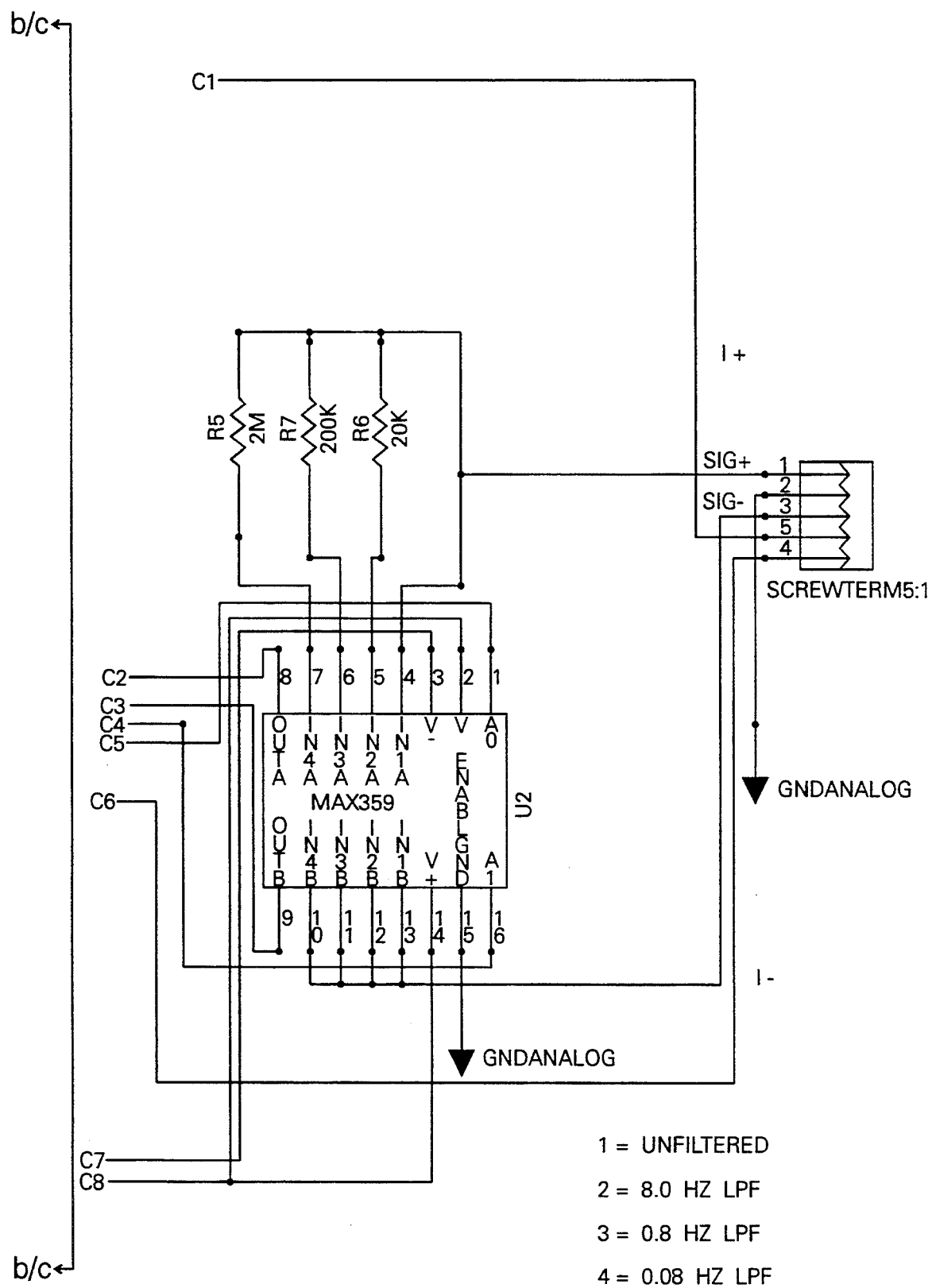

FIGS. 8(a)-8(c) show a detailed circuit schematic of a preferred embodiment of the A/D pod 14. With regard to the analog-to-digital converter chip, the MAX132 converter chip (shown as U1 in FIG. 8(a) and manufactured by Maxim Corporation of Sunnyvale, Calif.) was selected. A MAX132 circuit provided a full scale input of about ±200 mV to ±500 mV with good noise and drift levels. The ADC also incorporates features which eliminate 60 Hz noise sources from the acquired signal through an averaging technique. The A/D converting circuit also uses a multiplexer chip MAX359 (shown as U2 in FIG. 8(c)) to provide four analog signal filtering options of no signal filtering, 0.08 Hz, 0.8 Hz and 8 Hz. The filters are selected by pins P0 and P1 on the ADC. Finally the $V_{ref}$ source is shown in FIG. 8(b) using a zener diode (shown as D1) and a resistor chip (shown as R3) to provide the attenuated voltage reference. It should be understood that other diodes, and resistor and capacitor combinations may be used. By changing these components $V_{ref}$ signals of up to 1.2 V and 2.5 V are readily achievable. For instance, other jumper pad connections on the resistor chip may be used to obtain different $V_{ref}$ signals. In further embodiments, the jumper pads may be user selectable to provide a selectable $V_{ref}$ signal attenuation; however, this would probably require an additional multiplexer to facilitate the selection of the appropriate jumper positions and possibly the selection of a different integrating capacitor and resistor, depending on the range selected.

There are several advantages obtainable with a passively attenuated $V_{ref}$. There is a reduction in the number of components needed to generate the digital signal, since neither the analog signal nor the $V_{ref}$ must be amplified. Therefore, the noise that would otherwise be generated by these additional components is not present and the system would exhibit a reduced (compared to signal amplifying systems) sensitivity to temperature drift due to the minimization of components, and thus error sources. Moreover, since amplifiers are not needed to provide the $V_{ref}$ or amplify the analog signal, the noise sources created by the amplification process may be completely eliminated. The result is less noise at the inputs of the ADC chip.

The A/D pod 14 is also externally powered, which can significantly reduce the noise in the resulting digital signal. The external power source permits the A/D pod to be located outside the noise filled environment within the PC 12 which may otherwise interfere with the ADC and other components of the A/D pod 14. Moreover, external powering allows the A/D pod 14 to be packaged in a small configuration and be located close to the transducer where the actual measurements are taken. Close proximity to the transducer reduces the line length between the ADC and the transducer. Thus, the ability to locate the ADC in a minimum noise environment and in close proximity to the measurement source can minimize the noise input to the ADC 62.

Therefore, embodiments of the present invention using a passively attenuated $V_{ref}$ and external power source yield the following equation for the signal at the A/D:

$$\text{Signal}_{atA/D} = \text{Signal}_{Device} \pm \text{Noise}_{Device} \pm <0.1 \text{Noise}_{A/DLeads}$$

It can be readily appreciated that the above-equation has far fewer noise terms than the equation for the A/D converters in the prior art structures described in the background section.

Typical noise levels obtained in the above-described embodiments of the present invention are in the range of 4 μV RMS. The same tests, described in the background of the invention above, were performed on various embodiments of the present invention. The results showed that the circuits reduced the noise and offset problems found in real world applications of the prior art devices by a factor of 100 to 1000 times. A sample of the results from a zero level test are shown in FIG. 11. The combined noise and offset errors were reduced to under 5 μV RMS and about 8 μV peak-to-peak over long sampling periods. However, during shorter test periods, the results were even better (about 2-3 μV RMS and about 3-4 μV peak-to-peak).

Figure 9:
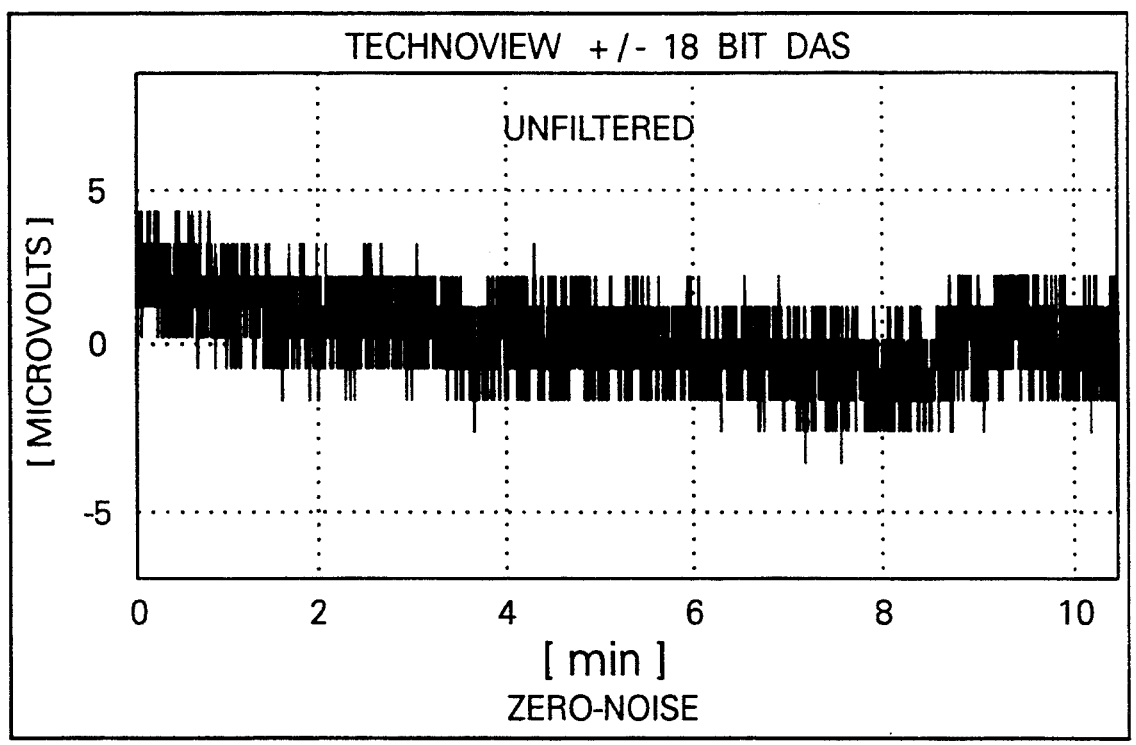
FIG. 9 is a plot of noise levels in an A/D convertor system according to an embodiment of the present invention.
Figure 10:
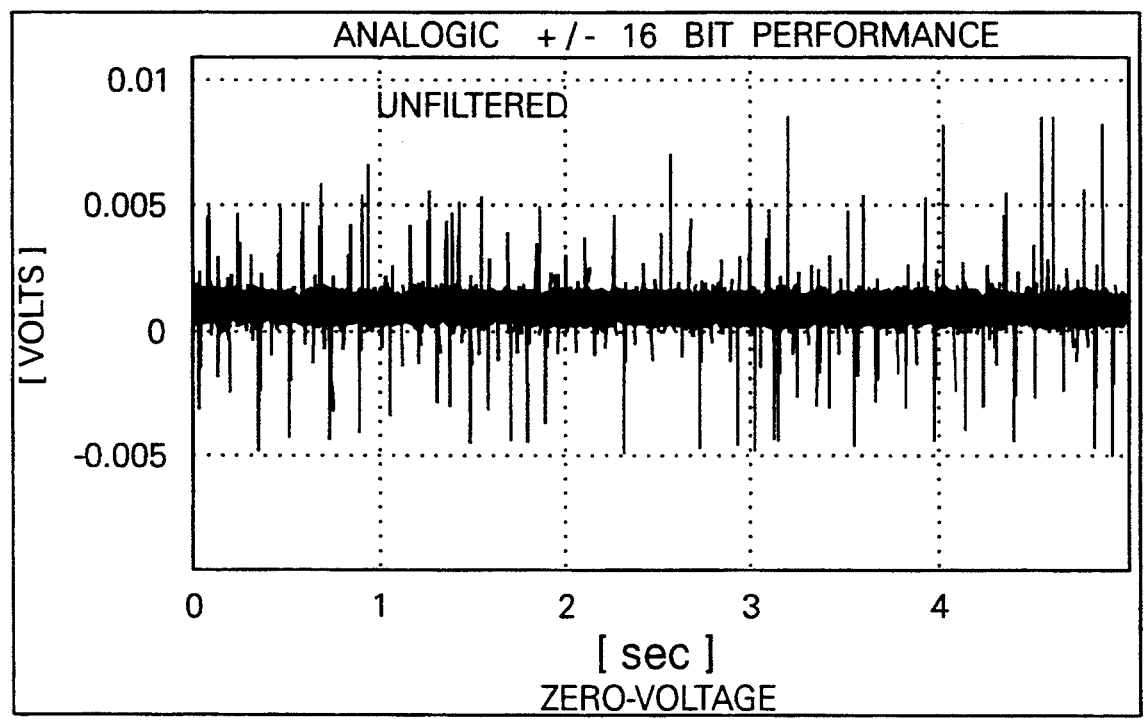
FIG. 10 is a plot of noise levels in a prior art A/D convertor system.

Comparisons of the two noise plots in FIGS. 9 and 10 show that embodiments of the present invention exhibit significantly less noise than converter systems in the prior art. For example, if FIG. 9 were superimposed on FIG. 10 using the same vertical scale, the noise in the FIG. 9 plot would be a thinner line than can be printed on FIG. 10. This is because FIG. 10 shows noise in millivolts and FIG. 9 shows noise in microvolts (a difference of 1000 times).

While the description above refers to particular embodiments of the present invention, it will be understood that many modifications may be made without departing from the spirit thereof. The accompanying claims are intended to cover such modifications as would fall within the true scope and spirit of the present invention.

The presently disclosed embodiments are therefore to be considered in all respects as illustrative and not restrictive, the scope of the invention being indicated by the appended claims, rather than the foregoing description, and all changes which come within the meaning and range of equivalency of the claims are therefore intended to be embraced therein.

What is claimed is:

1. An A/D converting system having low noise for converting an analog signal having a full scale input range into a digital signal, the system comprising:
   an interface circuit; and
   an A/D convertor circuit coupled to the interface circuit, the A/D converter circuit having a diode with two terminals and a passive attenuation circuit coupled in parallel between the two diode terminals to provide a voltage reference signal, and the voltage reference signal being attenuated by the passive attenuation circuit to correspond to the full scale input range of the analog signal.

2. A system according to claim 1, wherein the A/D circuit has an auto-zero capability to reduce effects of a system drift.

3. A system according to claim 1, wherein the passive attenuation circuit includes a resistor network.

4. A system according to claim 3, wherein the resistor network and a capacitor define a single pole low pass filter to attenuate high frequency noise.

5. A system according to claim 4, wherein the single pole filter attenuates the noise above 32 Hz.

6. A system according to claim 1, further comprising a selector for selecting a value from multiple possible values of attenuation of the voltage reference signal from the attenuation circuit.

7. A system according to claim 1, wherein the noise for the system is less than about 10 mV peak-to-peak.

8. A system according to claim 1, wherein the noise for the system is less than about 10 $\mu$V peak-to-peak.

9. A system according to claim 1, wherein the interface circuit can accommodate at least eight A/D converter circuits.

10. A system according to claim 9, wherein the interface circuit can be chained together with at least one additional interface circuit.

11. A system according to claim 10, wherein the interface circuit is chained with as many as thirty two other interface circuits, such that as many as 256 A/D converter circuits may be supported.

12. A system according to claim 1, wherein the A/D convertor circuit converts DC signals.

13. A system according to claim 1, wherein the interface drives the A/D convertor circuit serially with at least one of a plurality of A/D convertor circuits.

14. A system according to claim 1, wherein the A/D convertor circuit includes a driver circuit to drive at least one analog transducer.

15. A system according to claim 1, further including a power source, wherein the A/D convertor circuit is located separate and apart from the power source to reduce noise interference from the power source.

16. A system according to claim 1, further including a personal computer connected to the interface circuit, wherein the system is controlled and driven by the personal computer.

17. An A/D converting system having low noise for converting an analog signal having a full scale input range into a digital signal, the system comprising:
   a personal computer; and
   an A/D convertor circuit coupled to the personal computer, the A/D circuit having a diode with two terminals and a passive attenuation circuit coupled in parallel between the two diode terminals to provide a voltage reference signal, and the voltage reference signal being attenuated by the passive attenuation circuit to correspond to the full scale input range of the analog signal.

18. A system according to claim 17, wherein the A/D circuit has an auto-zero capability to reduce effects of a system drift.

19. A system according to claim 17, wherein the personal computer drives the A/D convertor circuit in parallel with at least one other A/D convertor circuit.

20. An A/D circuit having low noise for converting an analog signal having a full scale input range into a digital signal, the circuit comprising:
   an analog to digital conversion chip; and
   a voltage reference source having a diode with two terminals and a passive attenuation circuit coupled in parallel between the two terminals to provide a voltage reference signal for use by the analog to digital conversion chip; and
wherein the voltage reference signal is attenuated by the passive attenuation circuit to correspond to the full scale input range of the analog signal.

21. A circuit according to claim 20, wherein the passive attenuation circuit comprises a resistor network.

22. A circuit according to claim 21, wherein the resistor network and a capacitor are included in a single pole low pass filter to attenuate high frequency noise.

23. A circuit according to claim 20, wherein the diode is a zener diode.

24. A circuit according to claim 20, wherein the A/D converter circuit includes a multiplexer chip to selectively direct the analog signal to different filters and wherein the multiplexer chip provides the analog to conversion chip with the filtered analog signal.

25. A circuit according to claim 20, wherein the A/D circuit has an auto-zero capability to reduce effects of a system drift.

26. A circuit according to claim 20, wherein the A/D convertor circuit converts DC signals.

27. A circuit according to claim 20, wherein the A/D convertor circuit includes a driver circuit to drive at least one analog transducer.

28. A circuit according to claim 20, further including a power source, wherein the A/D convertor circuit is located separate and apart from the power source to reduce noise interference from the power source.

* * * * *